US009202963B2

United States Patent
Liu et al.

(10) Patent No.: US 9,202,963 B2
(45) Date of Patent: Dec. 1, 2015

(54) DUAL-SIDE ILLUMINATION IMAGE SENSOR CHIPS AND METHODS FOR FORMING THE SAME

(71) Applicant: Taiwan Semiconductor Manufacturing Company, Ltd., Hsin-Chu (TW)

(72) Inventors: Chih-Min Liu, Zhubei (TW); Honyih Tu, Hsin-Chu (TW); Calvin Yi-Ping Chao, Zhubei (TW); Fu-Lung Hsueh, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 261 days.

(21) Appl. No.: 13/683,819

(22) Filed: Nov. 21, 2012

(65) Prior Publication Data

US 2014/0138521 A1    May 22, 2014

(51) Int. Cl.
*H01L 31/18* (2006.01)
*H01L 27/146* (2006.01)

(52) U.S. Cl.
CPC ............ *H01L 31/18* (2013.01); *H01L 27/1464* (2013.01); *H01L 27/1469* (2013.01); *H01L 27/14618* (2013.01); *H01L 27/14636* (2013.01); *H01L 2224/48091* (2013.01); *H01L 2224/73265* (2013.01)

(58) Field of Classification Search
USPC ............... 250/208.1, 239, 216; 257/290–292, 257/440; 348/292–311; 438/106–127, 438/455–459, 64–67
See application file for complete search history.

(56) References Cited

U.S. PATENT DOCUMENTS

| | | | |
|---|---|---|---|
| 5,952,725 A * | 9/1999 | Ball ............................. 257/777 |
| 7,619,315 B2 * | 11/2009 | Kwon et al. .................. 257/777 |
| 7,619,683 B2 * | 11/2009 | Davis ........................... 348/374 |
| 8,241,961 B2 * | 8/2012 | Kim et al. .................... 438/118 |
| 2005/0046740 A1 * | 3/2005 | Davis ........................... 348/373 |
| 2010/0047567 A1 * | 2/2010 | Souriau ........................ 428/339 |
| 2010/0308455 A1 * | 12/2010 | Kim et al. .................... 257/734 |
| 2011/0049336 A1 | 3/2011 | Matsunuma | |
| 2011/0221941 A1 * | 9/2011 | Sato ............................. 348/294 |
| 2011/0234869 A1 * | 9/2011 | Hiramoto et al. ............ 348/294 |

* cited by examiner

*Primary Examiner* — Que T Le
*Assistant Examiner* — Carolynn A Moore
(74) *Attorney, Agent, or Firm* — Slater & Matsil, L.L.P.

(57) ABSTRACT

A Dual-Side Illumination (DSI) image sensor chip includes a first image sensor chip configured to sense light from a first direction, and a second image sensor chip aligned to, and bonded to, the first image sensor chip. The second image sensor chip is configured to sense light from a second direction opposite the first direction.

20 Claims, 8 Drawing Sheets

DUAL-SIDE ILLUMINATION IMAGE SENSOR CHIPS AND METHODS FOR FORMING THE SAME

BACKGROUND

In some applications of image sensor chips, two cameras are needed to obtain images from opposite directions. For example, mobile devices such as mobile phones may include two cameras on opposite sides. Two image sensor arrays facing opposite directions are thus needed to sense images.

The two image sensor chips were bonded to a same Printed Circuit Board (PCB). Since certain distance needs to be maintained to separate each of the image sensor chips from the respective focal lens, the thickness of the mobile application cannot be smaller than a combined thickness of the thickness of the PCB, the thicknesses of two image sensor chips, and two times the distance between the image sensor chips and the respective focal lens. Besides, the two image sensor chips need to have separate footprints, and cannot be placed on the PCB back-to-back and aligned to each other since each of them needs to route signals to and from the PCB.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Dual-Side Illumination (DSI) image sensor chip and the method of forming the same are provided in accordance with various exemplary embodiments. The intermediate stages of forming the DSI image sensor chip are illustrated. The variations and the operation of the DSI image sensor chip are discussed. Throughout the various views and illustrative embodiments, like reference numbers are used to designate like elements. In the embodiments, although stacked image sensors are used as examples to introduce the concept of the present disclosure, the stacking scheme and the manufacturing methods may be applied to the stacking of any other chips, including, and not limited to, logic die to logic die stacking, logic die to memory die stacking, memory die to memory die stacking, and the like.

Figure 1:
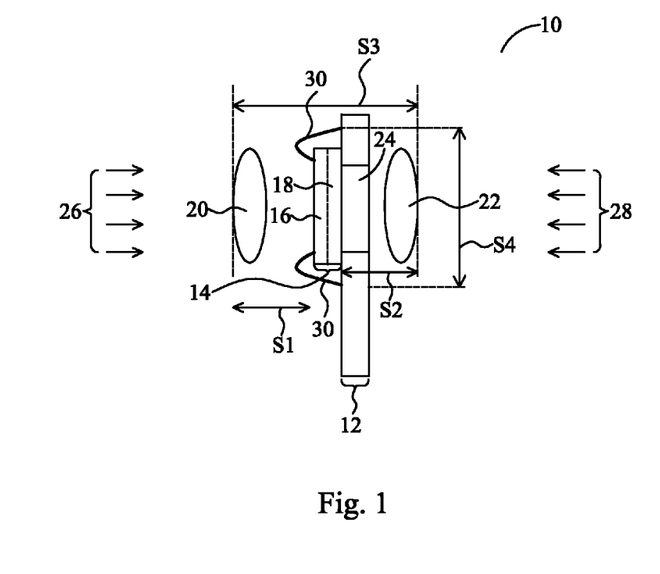
FIG. 1 illustrates a cross-sectional view of a system including a Dual-Side Illumination (DSI) image sensor chip, wherein the DSI image sensor chip is bonded on a Printed Circuit Board (PCB), and is configured to receive light from opposite directions.

FIG. 1 illustrates a cross-sectional view of system 10 incorporating DSI image sensor chip 14 therein. System 10 may be a mobile application system such as a mobile phone, a tablet personal computer, or the like. System 10 includes package component 12 such as a Printed Circuit Board (PCB), on which DSI image sensor chip 14 is bonded. DSI image sensor chip 14 includes image sensor chip 16, and image sensor chip 18 bonded to image sensor chip 16. Throughout the description, image sensor chip 16 is alternatively referred to as a top image sensor chip, and chip 18 is referred to as bottom image sensor chip. The concept of "top" and "bottom" chip, however, may be inversed. Image sensor chip 16 is configured to capture light 26 that passes through focal lens 20, and image sensor chip 18 is configured to capture light 28 that passes through focal lens 22. PCB 12 includes transparent window 24, which allows light 28 to pass through. The electrical signal of the images captured by DSI image sensor chip 14 is outputted through bond wires 30, for example, although the captured images may also be outputted through flip-chip bonds.

Figure 2:
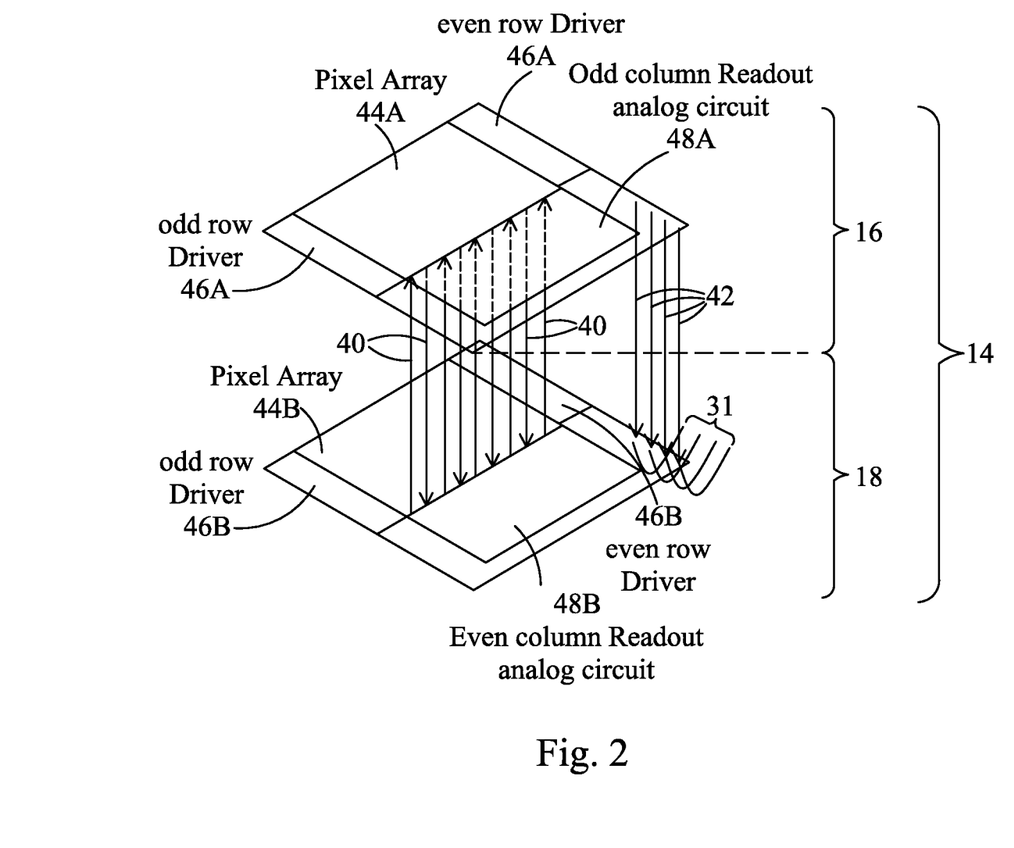
FIG. 2 illustrates the perspective view of the bonding of two image sensor chips to from a DSI image sensor chip.

FIG. 2 illustrates a perspective view of the bonding scheme of image sensor chip 16 to image sensor chip 18. The bonding between image sensor chips 16 and 18 is represented by arrows 40 and 42. Arrows 40 represent the bonded bond pads C1, D1, A0-A9, and B0-B9 in FIG. 3, which bond pads are used for transferring electrical signals generated by pixel array 44A in image sensor chip 16 and pixel array 44B in image sensor chip 18. Some of arrows 40 point from image sensor chip 16 to image sensor chip 18, representing the signals transferred from image sensor chip 16 to image sensor chip 18. Some other arrows 40 point from image sensor chip 18 to image sensor chip 16, representing the signals transferred from image sensor chip 18 to image sensor chip 16. Arrows 42 is illustrated as pointing from image sensor chip 16 to image sensor chip 18, representing that the signals processed in image sensor chip 16 are outputted to Input/output (IO) pads 31 through image sensor chip 18. The signals processed in image sensor chip 18 are also outputted through IO pads 31.

Image sensor chip 16 include image sensor array (also referred to as a pixel array) 44A, which includes photo diodes 50A (FIG. 3) configured to receive light, and convert light to electrical signals. Image sensor chip 16 further includes row driver(s) 46A, which, at a time, selects a row of pixel array 44A to process. Image sensor chip 16 also includes column readout circuit 48A, which processes the signal of a plurality of columns of image sensors (pixels) of the selected row of pixel array 44A. In some embodiments, row driver 46A is split into an odd-row driver and an even-row driver, both are denoted as 46A. Odd-row driver 46A selects and processes the odd rows, and even-row driver 46A selects and processes the even rows. In alternative embodiments, row driver 46A is not split, and a single row driver 46A handles both odd rows and even rows.

Similarly, image sensor chip 18 includes image sensor array 44B, which includes photo diodes 50B (FIG. 3) configured to receive light, and convert light to electrical signals. Image sensor chip 18 further includes row driver(s) 46B, which, at a time, selects a row of pixel array 44B to process. Image sensor chip 18 also includes column readout circuit 48B, which processes the signal of a plurality of columns of pixel of the row that is selected by row driver 46B. In some embodiments, row driver 46B is split into an odd-row driver and an even-row driver, both are denoted as 46B. Odd-row driver 46B processes the odd rows, and even-row driver 46B processes the even rows. In alternative embodiments, row-driver 46B is not split.

In some embodiments, one of column readout circuits 48A and 48B is an even-column readout circuit, and the other one of column readout circuits 48A and 48B is an odd-column readout circuit. In some exemplary embodiments, as shown in FIG. 2, circuit 48A is the odd-column readout circuit, and circuit 48B is the even-column readout circuit. In alternative embodiments, circuits 48A and 48B may be the even-column readout circuit and the odd-column readout circuit, respectively. For the convenience of discussion, in the following discussed examples, circuits 48A and 48B are referred to as an odd-column readout circuit and an even-column readout circuit, respectively. The odd-column readout circuit, such as 48A, is configured to handle the signals of the pixels in odd columns. The even-column readout circuit, such as 48B, is configured to handle the signals of the pixels in even columns. Accordingly, odd-column readout circuit 48A and even-column readout circuit 48B in combination may process signals from all columns of the selected row. The signals from pixel array 44A are sent to both odd-column readout circuit 48A and even-column readout circuit 48B, and the signals from pixel array 44B are also sent to both odd-column readout circuit 48A and even-column readout circuit 48B. Accordingly, although physically located on different image sensors chips 16 and 18, odd-column readout circuit 48A and even-column readout circuit 48B are shared by both image sensor chips 16 and 18. The processing of the signals from pixel array 44A and the processing of the signals from pixel array 44B may be achieved by odd-column readout circuit 48A and even-column readout circuit 48B during separate time slots.

Figure 3:
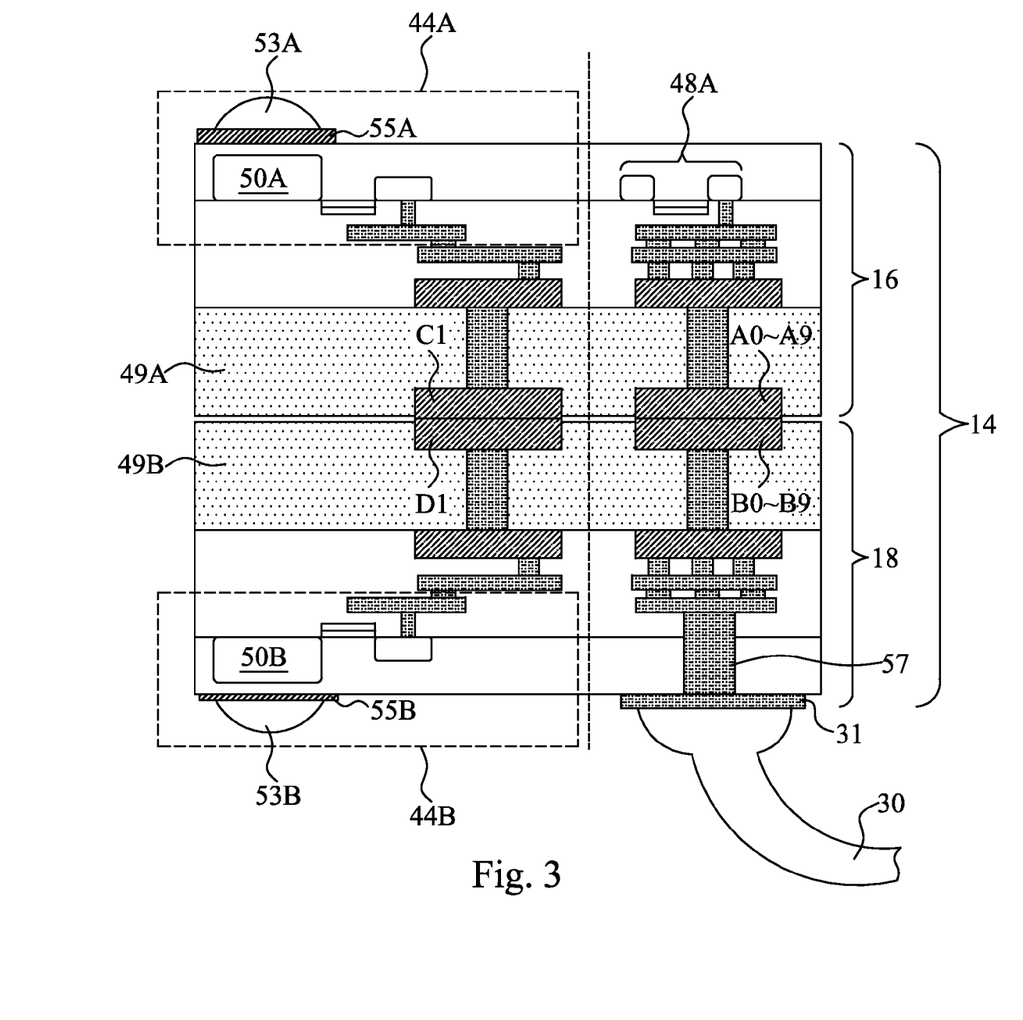
FIG. 3 illustrates a cross-sectional view of the bonding of two image sensor chips.

FIG. 3 illustrates a cross-sectional view of portions of image sensor chips 16 and 18. Image sensor 50A, which may be a photo diode, and its connecting processing devices (such as transfer gate, source follower, reset transistor, and floating diffusion region, which are not shown herein) form a pixel unit with the respective micro lens 53A and color filter 55A. The pixel unit is a part of image sensor array 44A, micro-lens 53A, and color filter 55A. Although one pixel unit is illustrated, image sensor chip 16 includes a plurality of pixel units forming array 44A. Similarly, image sensor 50B and its connecting processing devices (such as transfer gate, source follower, reset transistor, and floating diffusion region) form a pixel unit with the respective micro lens 53B and color filter 55B. The pixel unit is a part of image sensor array 44B. Bond pads A0-A9, B0-B9, C1, and D1 may be formed on the carrier 49A and 49B of the respective chips 16 and 18. Carriers 49A and 49B may be glass carriers, semiconductor carriers including no active (such as transistors) or passive devices (such as capacitors and resistors) therein, or the like. Bond pads A0-A9 are represented by one bond pad, and bond pads B0-B9 are represented by one bond pads. On actual chips, A0-A9 and B0-B9 (shown in FIG. 6), each of the single illustrated bond pad A0-A9, and the single illustrated B0-B9 represents a plurality of bond pads.

Pixel array 44A is electrically coupled to bond pads C1. Pixel array 44B is electrically coupled to bond pads D1, which is bonded to, and electrically connected to, bond pads C1. Although one bond pad C1 and one bond pad D1 are shown, there is a plurality of bond pads C1 and a plurality of bond pads D1. The bonding of bond pads C1 and D1 is illustrated by arrows 40 in FIG. 2. Through bonded pads C1 and D1, signals in odd-column pixels of pixel array 44A may be transferred to even-column readout circuit 48B (FIG. 2), and processed therein. Signals in even-column pixels of pixel array 44B may be transferred to odd-column readout circuit 48A (FIG. 2), and processed therein.

The circuits in image sensor chip 16 may also transfer the signals to bond pad A0-A9, which are bonded to the respective ones of bond pads B0-B9 in image sensor chip 18. The signals may thus be outputted to IO pads 31 through bond pads A0-A9 and B0-B9 and through-substrate via(s) 57.

As shown in FIG. 3, bond pads A0-A9 may be connected to the circuits such as column readout circuit 48A in the respective image sensor chip 16. Accordingly, bond pads A0-A9 are referred to as circuit-connecting bond pads. Bond pads B0-B9 do not receive signals from circuits in the same chip 18 directly, and are used as the signal paths for image sensor chip 16 to output signals. Accordingly, bond pads B0-B9 are referred to as empty bond pads or via bond pads.

Figure 4:
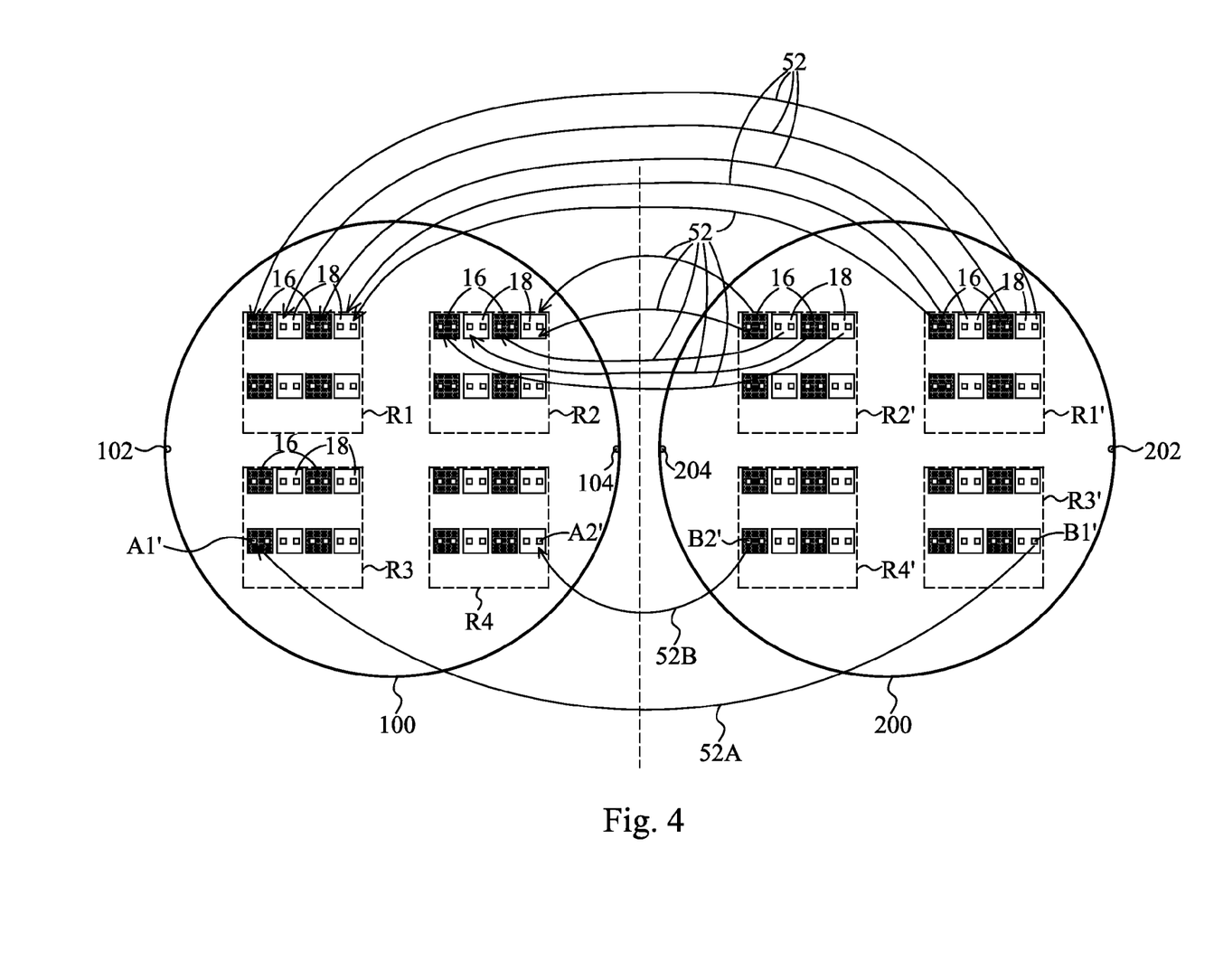
FIGS. 4 and 5 illustrate the top view and cross-sectional view, respectively, of two wafers, which are bonded to each other to form a plurality of DSI image sensor chips.

FIG. 4 illustrates the formation of the DSI image sensor chip 14 through wafer-to-wafer bonding. Wafers 100 and 200 are illustrated, and are identical to each other. Wafers 100 and 200 may be formed using identical or different process steps, identical lithography masks, and/or identical or different process conditions. Accordingly, the description of wafer 100 also applies to wafer 200, and vice versa. To form DSI image sensor chips 14, wafer 200 may be place aside wafer 100, and may be oriented in the same direction as wafer 200. Next, wafer 200 is flip onto wafer 100 face to face, with point 202 overlapping point 102, and point 204 overlapping point 104. A wafer-to-wafer bonding is then performed to bond wafer 200 to wafer 100, wherein bond pads of wafer 200 are bonded to wafer 100. After the bonding, the bonded wafers 100 and 200 are sawed apart into a plurality of DSI image sensor chips 14.

Referring back to FIGS. 2 and 3, top image sensor chip 16 and bottom image sensor 18 of DSI image sensor chip 14 may have different structures. Referring back to FIG. 4, both top image sensor chip 16 and bottom image sensor chip 18 are formed in wafer 100 (and in wafer 200). In some embodiments, about a half of the image sensor chips in wafer 100 are top image sensor chips 16, and are identical to each other. About a half of the image sensor chips in wafer 100 are bottom image sensor chips 18, and are identical to each other. In each row and/or each column of chips in wafer 100, top image sensor chips 16 and bottom image sensor chips 18 may be allocated in an alternating layout, although different layouts may be used.

In some embodiments, bond pads (such as A0-A9, B0-B9, C1, and D1) in wafer 100 are symmetric to the bond pads in wafer 200, which means that when wafer 200 is flipped on and aligned to wafer 100, the bond pads in wafer 200 are aligned to the bond pads in wafer 100, and hence can be bonded to each other. For example, bond pad A1' in wafer 100 is aligned to bond B1' in wafer 200, wherein arrow 52A represents the flipping of wafer 200 onto wafer 100 and the alignment and the bonding of bond pads A1' and B1'. Bond pad A2' in wafer 100 is aligned to bond B2' in wafer 200, wherein arrow 52B represents the flipping of wafer 200 onto wafer 100 and the alignment and the bonding of bond pads A2' and B2'. In some exemplary embodiments, substantially each of the bond pads in wafer 100 is symmetric to a bond pad in wafer 200, and vice versa.

When wafer 200 is flipped onto and bonded to wafer 100, each of top image sensor chips 16 in wafer 100 is aligned to, and bonded to, one of bottom image sensor chips 18 to form a DSI image sensor chip, with the bond pads in chip 16 aligned to and bonded to the bond pads in chip 18. Similarly, each of bottom image sensor chips 18 in wafer 100 is aligned to, and bonded to, one of top image sensor chips 16 in wafer 200 to form another DSI image sensor chip 14.

Figure 5:
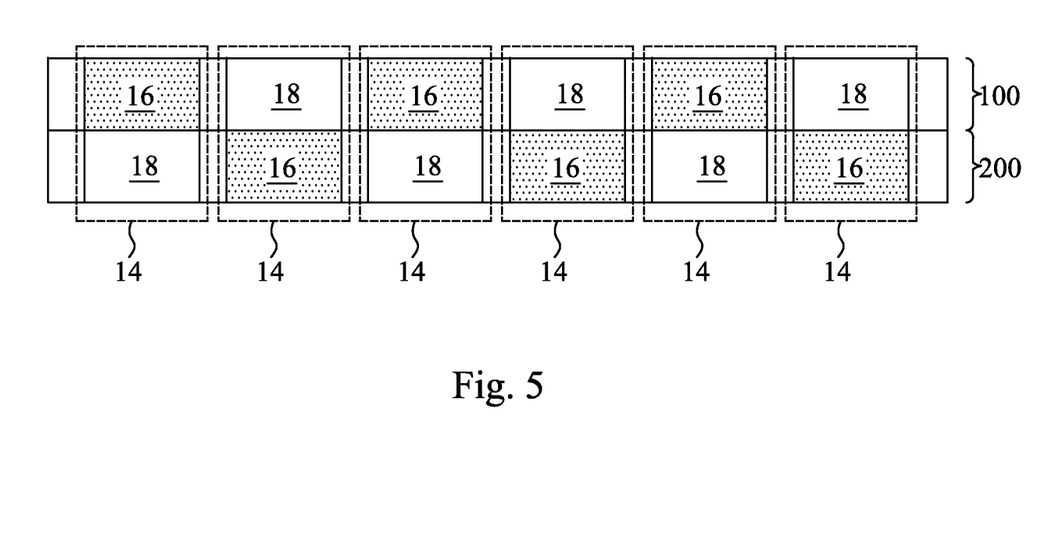

FIG. 5 illustrates a cross-sectional view of a portion of bonded wafers 100 and 200. As shown in FIG. 5, the plurality of DSI image sensor chips 14 has two opposite settings. In the first setting, image sensor chip 16 is over image sensor chip 18. In the second setting, image sensor chip 16 is underlying image sensor chip 18. The DSI image sensor chips 14 with different settings, however, may have an identical structure.

It is realized that in the manufacturing of wafers 100 and 200, the related exposure of photo resists (not shown), which are used to form devices, features, and patterns in wafers 100, may be exposed on reticle scale, rather than on chip scale. Wafer 100 includes exemplary reticles R1 through R4, and wafer 200 includes exemplary reticles R1' through R4', although more reticles are not shown. A reticle covers a plurality of chips. During the exposure, the photo resist is applied on the respective wafer 100 and 200, and exposed reticle-by-reticle. That is, a reticle is exposed, and then the exposure equipment (such as a stepper) steps away to the next reticle and expose the photo resist using the same lithography mask. To ensure that the corresponding bond pads of chips 16 and 18 may accurately bond to each other, and chips 16 may be accurately bonded to chips 18, the reticles are also symmetric, and reticles R1, R2, R3, and R4 in wafer 100 are symmetric to reticles R1', R2', R3', and R4' in wafer 200, respectively. This means that when wafer 200 is flipped onto wafer 100, reticles R1', R2', R3', and R4' are aligned to reticles R1, R2, R3, and R4, respectively.

Figure 6:
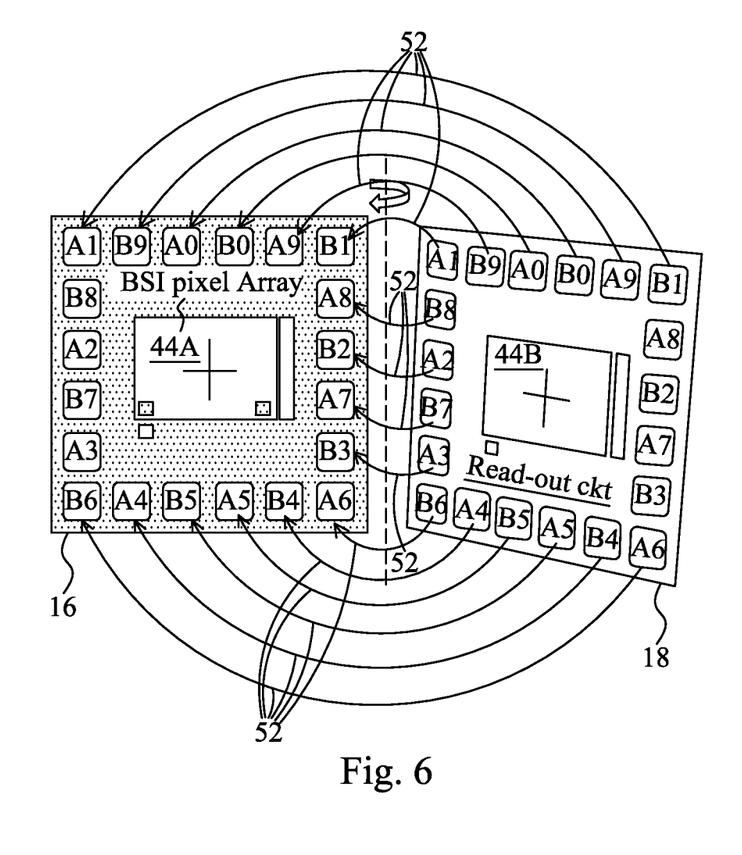
FIG. 6 illustrates the bond pads of the two image sensor chips, which are bonded to each other to form a DSI image sensor chip.

FIG. 6 illustrates the exemplary allocation of bond pads in image sensor chips 16 and 18. Referring back to FIG. 3, to ensure that the signal in top image sensor chip 16 is outputted to IO pads 31 through bottom image sensor chip 18 without clashing with the signals generated inside bottom image sensor chip 18, a bond pad that outputs signal to IO pad 31 needs to be bonded to an empty bond pad in bottom image sensor chip 18. Referring to FIG. 6, a plurality of bond pads A0 through A9 and B0 through A9 are illustrated in each of chips 16 and 18 in accordance with exemplary embodiments. The bond pads starting with letter "A" represent the bond pads that receive signals generated inside the same chip, and the bond pads starting with letter "B" represent the empty bond pads that do not receive signals generated in the same chip. When chip 18 is flipped over and bonded to chip 16, as illustrated by arrows 52, each of circuit-connecting bond pads A0-A9 is bonded to a respective empty bond pads B0-B9. In some embodiments, the output of the signals in the resulting DSI image sensor chip 14 is through IO pads 31 (FIG. 3) in bottom image sensor chip 18, and not through any output pad in top image sensor chip 16. Accordingly, all empty bond pads are located in bottom image sensor chip 18. In alternative embodiments, as shown in FIG. 6, both chips 16 and 18 have empty bond pads B0-B9. Accordingly, the output of the signals in the resulting DSI image sensor chip 14 may be through IO pads 31 (not shown) in both chips 16 and 18.

Figure 7:
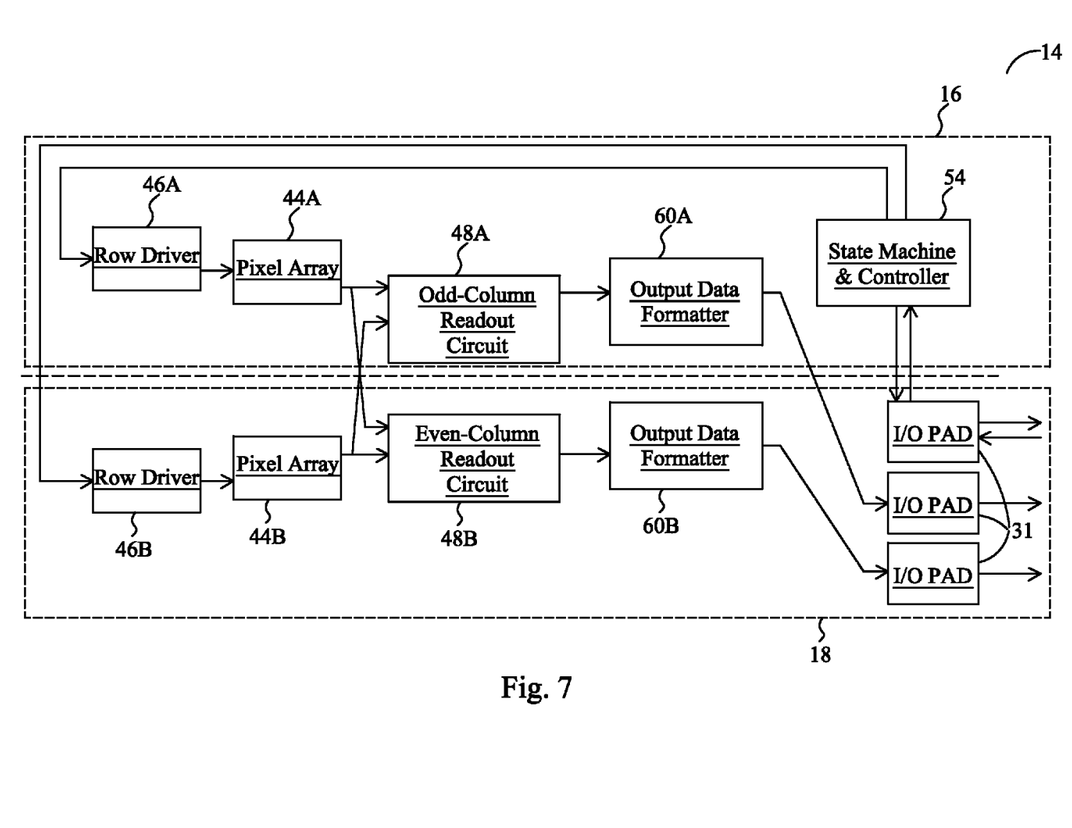
FIG. 7 illustrates the block diagram of the circuits and bond pads in a DSI image sensor chip in accordance with some embodiments, wherein column readout circuits in the two image sensor chips of the DSI image sensor chip are shared.

FIG. 7 illustrates a block diagram of DSI image sensor chip 14, which includes image sensor chips 16 and 18 bonded to each other. In some embodiments, state machine & controller 54 is located in one of chips 16 and 18. State machine & controller 54 controls, at a specific time slot, which of the chips 16 and 18 may read data from its pixel array. Assuming at a time slot, it is determined that chip 16 should perform the data readout, state machine & controller 54 then controls row driver 46A in chip 16 to select a row of pixel array 44A to read from. In the meantime, state machine & controller 54 may control row driver 46B not to select any row to read from. The selected row includes odd columns and even columns. The data read from the odd columns are sent to odd-column readout circuit 48A to process. Simultaneously, the data read from the even columns are sent to even-column readout circuit 48B to process. Accordingly, the data read from the pixel array 44A are split to the column readout circuits on different chips to process. Output data formatter 60A processes the data from odd-column readout circuit 48A. For example, output data formatter 60A may adjust the digital gain, the offset, the Red-Green-Blue (RGB) balance, and the like. Output data formatter 60B receives, and processes, the data from even-column readout circuit 48B. The odd-column data generated by output data formatter 60A is then outputted to IO pads 31 in chip 18 through empty pads B0-B9 that are shown in FIG. 6. The even-column data generated by output data formatter 60B may also be sent to IO pads 31 in chip 18.

Similarly, in another time slot, state machine & controller 54 controls row driver 46A in chip 18 to select a row of pixel array 44B to read from. In the meantime, state machine & controller 54 controls row driver 46A not to select any row to read from. The data read from the columns in the selected row in pixel array 44B is then split into odd column data and even column data, and processed by odd-column readout circuit 48A and even-column readout circuit 48B simultaneously, and then outputted to IO pads 31.

In the embodiments, each of the column readout circuits in chips 16 and 18 is shared by both chips 16 and 18. Therefore, the sizes of chips 16 and 18 may be reduced due to the fact that the column readout circuit in each of chips 16 and 18 is cut by a half since it processes either even columns or odd columns, but not both, of the data.

Figure 8:
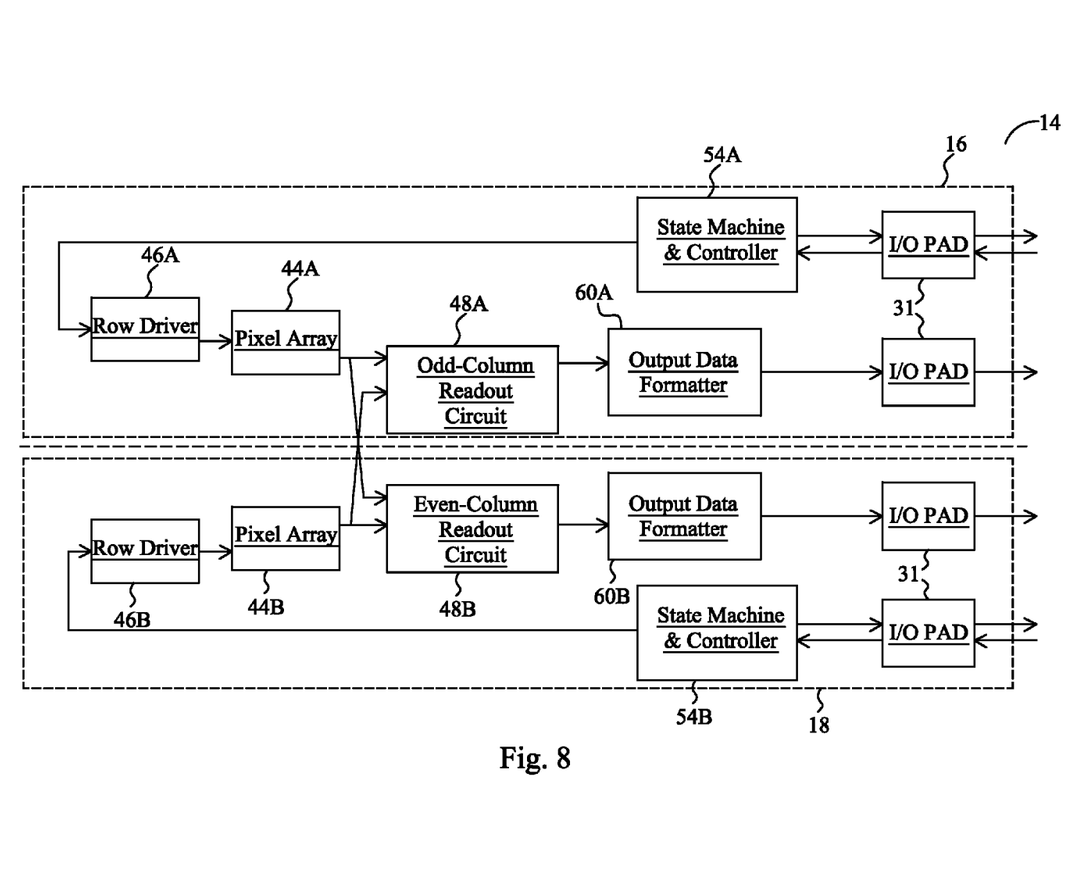
FIG. 8 illustrates the block diagram of the circuits and bond pads in a DSI image sensor chip in accordance with alternative embodiments.

FIG. 8 illustrates block diagram of DSI image sensor chip 14 in accordance with alternative embodiments. In these embodiments, the state machine & controller 54 in FIG. 7 is split into state machine & controller 54A and 54B, which are disposed in chips 16 and 18, respectively. Furthermore, each of chips 16 and 18 may have their own IO pads 31. Accordingly, cross-chip operation is reduced. Furthermore, it is observed that both chips 16 and 18 have full image sensor chip functionality, and hence each of chips 16 and 18 may be used as a single-side illumination chip, and does not have to be included in a DSI image sensor chip.

Referring back to FIG. 1, it is observed that the minimum thickness of system 10 is partially determined by distances S1 and S2 and the thickness of image sensor chips 16 and 18. Distances S1 and S2 are the distances from DSI image sensor chip 14 to focal lenses 20 and 22, respectively. The thickness of PCB 12, however, does not affect the minimum thickness of system 10 since it is included in distance S2. The minimum thickness of system 10 is smaller than the minimum thicknesses of conventional systems that adopt two image sensor bonded on opposite sides of a PCB. The difference between the minimum thicknesses of conventional systems and the minimum thickness of system 10 may be equal to the thickness of PCB 12. Furthermore, the footprint S4 of DSI image sensor chip 14, which footprint is the dimension of DSI image sensor chip 14 and the respective bond wires 30, is smaller than in conventional systems, in which two separate image sensor chips are used.

In the embodiments, the stacked image sensor chips 16 and 18, although having different structures, are manufactured using a same wafer design. Accordingly, only one set of lithography masks is needed to form stacked chips/wafers that have different structures. The cost of design and manufacture is thus reduced.

In accordance with embodiments, a DSI image sensor chip includes a first image sensor chip configured to sense light from a first direction, and a second image sensor chip aligned to, and bonded to, the first image sensor chip. The second image sensor chip is configured to sense light from a second direction opposite the first direction.

In accordance with other embodiments, a wafer includes a first chip having a first structure and comprising first bond pads at a first surface of the first wafer, and a second chip having a second structure different from the first structure. The second chip includes second bond pads at the first surface of the first wafer. The first wafer is configured so that when flipped onto the first chip, the second bond pads are aligned to respective ones of the first bond pads.

In accordance with yet other embodiments, a method includes bonding a first wafer to a second wafer identical to the first wafer. Each of the first wafer and the second wafer includes a first plurality of chips identical to each other, and a second plurality of chips identical to each other and different from the first plurality of chips. Each of the first plurality of chips in the first wafer is bonded to one of the second plurality of chips in the second wafer. Each of the second plurality of chips in the first wafer is bonded to one of the first plurality of chips in the second wafer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a Dual-Side Illumination (DSI) image sensor chip comprising:
a first image sensor chip configured to sense light from a first direction; and
a second image sensor chip aligned to the first image sensor chip, wherein a surface of the second image sensor chip is bonded directly to a surface of the first image sensor chip, wherein the second image sensor chip is configured to sense light from a second direction opposite the first direction.

2. The device of claim 1 further comprising:
a first column readout circuit in the first image sensor chip; and
a second column readout circuit in the second image sensor chip, wherein the first column readout circuit and the second column readout circuit are configured to simultaneously process a same row of a pixel array in the first image sensor chip.

3. The device of claim 2, wherein a first one of the first and the second column readout circuits is configured to process data read from odd columns of the row, and a second one of the first and the second column readout circuits is configured to process data read from even columns of the row.

4. The device of claim 2, wherein the first column readout circuit and the second column readout circuit are configured to simultaneously process a same row of a pixel array in the second image sensor chip.

5. The device of claim 1 further comprising:
a printed circuit board, wherein the DSI image sensor chip is bonded to the printed circuit board; and
a transparent window in the printed circuit board, wherein the transparent window is aligned to the DSI image sensor chip to allow light to pass through the transparent window and received by the DSI image sensor chip.

6. The device of claim 1, wherein one of the first image sensor chip and the second image sensor chip comprises a state machine & controller configured to control both the first and the second image sensor chips to read data from a respective pixel array.

7. The device of claim 1:
wherein the first image sensor chip comprises a first carrier, with first bond pads formed at a surface of the first carrier; and
wherein the second chip image sensor comprises a second carrier, with second bond pads formed at a surface of the second carrier, and wherein the first bond pads are bonded to the second bond pads.

8. A device comprising:
a first wafer comprising:
a first chip having a first structure and comprising first bond pads at a first surface of the first wafer; and
a second chip having a second structure different from the first structure, wherein the second chip comprises second bond pads at the first surface of the first wafer, wherein the first chip and the second chip share a single contiguous semiconductor substrate, and wherein the first wafer is configured so that when the second chip is flipped onto the first chip, the second bond pads are aligned to and facing respective ones of the first bond pads.

9. The device of claim 8, wherein the first chip and the second chip are image sensor chips, and wherein each of the first chip and the second chip comprises a micro lens at a second surface of the first wafer.

10. The device of claim 9, wherein the first chip comprises a first column readout circuit, the second chip comprises a second column readout circuit, wherein the first column readout circuit is configured to receive data read from a pixel array in the second chip, and wherein the second column readout circuit is configured to receive data read from a pixel array in the first chip.

11. The device of claim 8 further comprising a second wafer identical to, and bonded to, the first wafer, wherein each of the first wafer and the second wafer comprises:
a first plurality of chips identical to the first chip; and
a second plurality of chips identical to the second chip, wherein the first chip in the first wafer is bonded to one of the second plurality of chips in the second wafer, and wherein the second chip in the first wafer is bonded to one of the first plurality of chips in the second wafer.

12. The device of claim 8, wherein one of the first chip and the second chip comprises a plurality of empty bond pads.

13. The device of claim 8, wherein the first wafer comprises:
a first plurality of chips identical to the first chip; and a second plurality of chips identical to the second chip, wherein the first plurality of chips and the second plurality of chips are allocated in an alternating layout.

14. The device of claim 8, wherein each of the first chip and the second chip comprises a column readout circuit.

15. A method comprising:
bonding a first wafer to a second wafer identical to the first wafer, wherein each of the first wafer and the second wafer comprises:
  a first plurality of chips identical to each other; and
  a second plurality of chips identical to each other and different from the first plurality of chips, wherein the first plurality of chips and the second plurality of chips share a single contiguous semiconductor substrate, wherein each of the first plurality of chips in the first wafer is bonded to one of the second plurality of chips in the second wafer, and wherein each of the second plurality of chips in the first wafer is bonded to one of the first plurality of chips in the second wafer.

16. The method of claim 15 further comprising, after the step of bonding, sawing the first wafer and the second wafer into a plurality of stacked chips identical to each other.

17. The method of claim 16, wherein the first plurality of chips and the second plurality of chips are image sensor chips, and wherein the method further comprises:
  bonding one of the plurality of stacked chips to a Printed Circuit Board (PCB), wherein the one of the plurality of stacked chips is aligned to a transparent window in the PCB.

18. The method of claim 17 wherein each of the second plurality of chips comprises a plurality of empty bond pads that are not connected to other circuits in each of the second plurality of chips, and wherein each of the plurality of empty bond pads is bonded to a circuit-connecting bond pad in a respective one of the first plurality of chips, and wherein the circuit-connecting bond pad is connected a column readout circuit in the respective one of the first plurality of chips.

19. The method of claim 18 wherein the column readout circuit is configured to receive data read from a pixel array in a respective one the second plurality of chips.

20. The method of claim 15 further comprising:
  forming a plurality of bond pads in each of the first plurality of chips and the second plurality of chips in each of the first wafer and the second wafer, wherein the plurality of bond pads are on a first side of the each of the first wafer and the second wafer; and
  forming a plurality of micro lenses in each of the first plurality of chips and the second plurality of chips in each of the first wafer and the second wafer, wherein the plurality of micro lenses are on a second side of the each of the first wafer and the second wafer, with the second side opposite to the first side.

* * * * *